United States Patent
Oomori (10) Patent No.: US 7,856,038 B2
(45) Date of Patent: Dec. 21, 2010

(54) LIGHT-EMITTING MODULE INSTALLING THERMO-ELECTRIC CONTROLLER

(75) Inventor: Hirotaka Oomori, Kanagawa (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 567 days.

(21) Appl. No.: 11/727,653

(22) Filed: Mar. 27, 2007

(65) Prior Publication Data
US 2007/0237196 A1 Oct. 11, 2007

(30) Foreign Application Priority Data
Mar. 27, 2006 (JP) .......................... P.2006-085528
May 30, 2006 (JP) .......................... P.2006-150484

(51) Int. Cl.
*H01S 3/04* (2006.01)
(52) U.S. Cl. .......................................... 372/36; 372/34
(58) Field of Classification Search .................. 372/36, 372/34
See application file for complete search history.

(56) References Cited
U.S. PATENT DOCUMENTS

| | | | |
|---|---|---|---|
| 5,212,699 A | 5/1993 | Masuko et al. | |
| 5,214,660 A * | 5/1993 | Masuko et al. ................. | 372/34 |
| 6,101,200 A | 8/2000 | Burbidge et al. | |
| 6,856,475 B2 | 2/2005 | Nasu et al. | |
| 2003/0043868 A1 | 3/2003 | Stewart et al. | |
| 2004/0245446 A1 | 12/2004 | Oomori et al. | |

FOREIGN PATENT DOCUMENTS

| | | | |
|---|---|---|---|
| JP | 61071689 A * | 4/1986 | |
| JP | 04-075394 | 3/1992 | |
| JP | 04-132286 | 5/1992 | |
| JP | 11-238946 | 8/1999 | |
| JP | 2003-142766 | 5/2003 | |
| JP | 2003-142767 | 5/2003 | |
| JP | 2004-253779 | 9/2004 | |

\* cited by examiner

*Primary Examiner*—Tod T Van Roy
*Assistant Examiner*—Joshua King
(74) *Attorney, Agent, or Firm*—McDermott Will & Emery LLP (57) ABSTRACT

There is provided a light-emitting module which suppresses wavelength drift. A light-emitting module according to the invention includes a stem and a cap fixed to the upper surface of the stem. A thermo-electric cooler is mounted on the stem and a base is mounted on the thermo-electric cooler. A laser diode is mounted on one side of the base. A thermistor that measures the temperature of the laser diode is mounted on another side. The other side includes an overhung portion that blocks radiant heat transmitting from the cap toward the thermistor.

1 Claim, 13 Drawing Sheets

LIGHT-EMITTING MODULE INSTALLING THERMO-ELECTRIC CONTROLLER

This application is based on and claims the benefit of priority from the prior Japanese Patent Application No. 2006-085528, filed on Mar. 27, 2006 and No. 2006-150484, filed on May 30, 2006, the entire contents of which are hereby incorporated by reference.

BACKGROUND OF THE INVENTION

1. Technical Field

The present invention relates to a light-emitting module.

2. Background Art

The package of an optical transmitter including a semiconductor laser element has two types as follows:

One is a so-called butterfly type package disclosed in U.S. Pat. No. 6,856,475. The other is a so-called coaxial type package disclosed in U.S. Appl. Pub. No. 2004-245446A and 2003-043868A.

The laser module described in U.S. Pat. No. 6,856,475 comprises a butterfly type package, a base accommodated in the package, a thermo-electric cooler arranged between the package and the base, and a device to be controlled in temperatures such as a laser diode, a lens or a photo diode mounted on the base. An object of the invention according to U.S. Pat. No. 6,856,475 is to provide a laser module that covers each element to be controlled in temperatures mounted on a base with a radiation-shielding member so as to reduce heat transmitted from a package to the device to be controlled in temperatures and reduce the amount of heat to be cooled by a thermo-electric cooler thus suppressing the power consumption.

On the other hand, a laser module having a coaxial type package disclosed in US 2004-245446A or US 2003-043868A must measure the temperature of a laser diode (hereinafter referred to as an LD) in order to control the LD so that a thermistor is arranged in close to the LD.

However, with a coaxial type package, a distance between an LD and a case is about 0.2 mm. Accordingly, arranging a thermistor in close to an LD inevitably positions the thermistor closer to the case wall surface. The thermistor is thus influenced by the temperature outside the package (radiation from the case wall surface) thus resulting in an error in the temperature measurement of the LD. A thermo-electric cooler that mounts the LD cools or heats the LD based on the temperature measured by the thermistor so that an error in the temperature measurement leads to excessive cooling or excessive heating. As a result, a wavelength drift occurs.

To be more specific, assuming the temperature of the LD to T[° C.], the temperature signal from the temperature measuring element includes a rise or drop in the temperature Δ[° C.] caused by the radiation from the case. Thus, the LD is excessively cooled or heated to T-Δ[° C.] by the thermoelectric cooler. Thus, it is difficult to accurately control the temperature of the LD to a predetermined value.

In particular, this problem is critical in a case, when an optical transmitter is used for optical communications of DWDM (Dense Wavelength Division Multiplexing). The wavelength interval of signal light is set to be quite narrow in optical communications of DWDM. Thus, it is necessary to extremely minimize the variation in the light-emitting wavelength of the LD whose emitting wavelength varies with temperature. In a conventional optical transmitter, for example, a circuit is provided for maintaining the emitting wavelength of the LD constant to suppress the fluctuation of the emitting wavelength. However, this approach results in an increased size of a peripheral circuit of the optical transmitter.

A heat-shielding member described in US 2003-043868A covers the LD and other elements to be cooled at the same time although it is difficult to provide such members within a coaxial type package. More specifically, the coaxial type package has a structure where a case supports a lens so that the spacing between the LD and the case is extremely small, accordingly, it is difficult to provide a heat-shielding member described in U.S. Pat. No. 6,856,475.

SUMMARY OF THE INVENTION

A light-emitting module according to the invention emits an optical signal. The light-emitting module includes a semiconductor laser diode, a thermistor, a base, and a thermo-electric cooler. These members are enclosed in a package with a cylindrical cap and a disk-shaped stem. The laser diode outputs the optical signal under a predetermined temperature. The base that mounts a laser diode and a thermistor is mounted on the thermo-electric cooler. The thermistor detects the temperature of the laser diode. Based on the detected information, the thermo-electric cooler keeps the temperature of the laser diode constant. The light-emitting module according to the invention has a feature that the base shields the thermal radiation from the cap.

The base may include a first side that mounts a semiconductor laser thereon and a second side that mounts a thermistor thereon. The second side may include an overhung portion and the thermistor may be mounted beneath the overhung portion so that the overhung portion shields the heat radiated from the cap. Further, the second side may be a surface that rises at an obtuse angle with respect to the bottom surface that comes into contact with the upper plate of the thermo-electric cooler. The second side may include a third surface and a fourth surface extending substantially in a perpendicular direction with respect to the bottom surface of the base and the fourth surface may protrude further than the third surface so that the fourth surface may form an overhung portion.

According to another aspect, a base may include a first portion and a second portion. The first portion may be virtually rectangular and mount a laser diode on one of its sides and a thermistor on another side. Further, the second portion may be attached to another side of the first portion and an opening may be provided in the second portion so as to expose the thermistor mounted on the second surface in this opening. The side wall of the opening may function as an overhung portion so as to shield the heat radiated from the cap.

According to another aspect, a light-emitting module may include a carrier, a laser diode may be mounted on one surface of the carrier, a thermistor may be mounted on another surface of the carrier and the other surface may be attached to a base. A hollow may be formed on the surface of the base where the carrier is attached and the hollow may receive the thermistor mounted on the other surface of the carrier. The side wall of the base where the hollow is formed may shield the heat radiated from the carrier.

According to another aspect of the light-emitting module of the invention is that, a supporting portion and a depressed portion may be formed on the ceiling of a cap and the supporting portion may protrude into a space formed by the cap and a stem while the depressed portion may protrude toward the outside of a package with respect to the space. The thermistor may be mounted on a side of a base in a position facing the depressed portion of the cap. In a case that a lens, focusing light output from a laser diode, is mounted on the supporting portion of the cap, the spacing between the thermistor mounted on the base and the ceiling of the cap is not shortened by the depressed portion of the ceiling although the spacing between the lens and the semiconductor laser is reduced to improve the focusing efficiency. Accordingly, the influence of the heat radiated from the cap ceiling may be avoided.

DESCRIPTION OF PREFERRED EMBODIMENTS

Embodiments of a light-emitting module according to the invention will be detailed referring to attached figures. In the description of figures, a same element is given a same symbol and duplicated description is omitted.

First Embodiment

Figure 1:
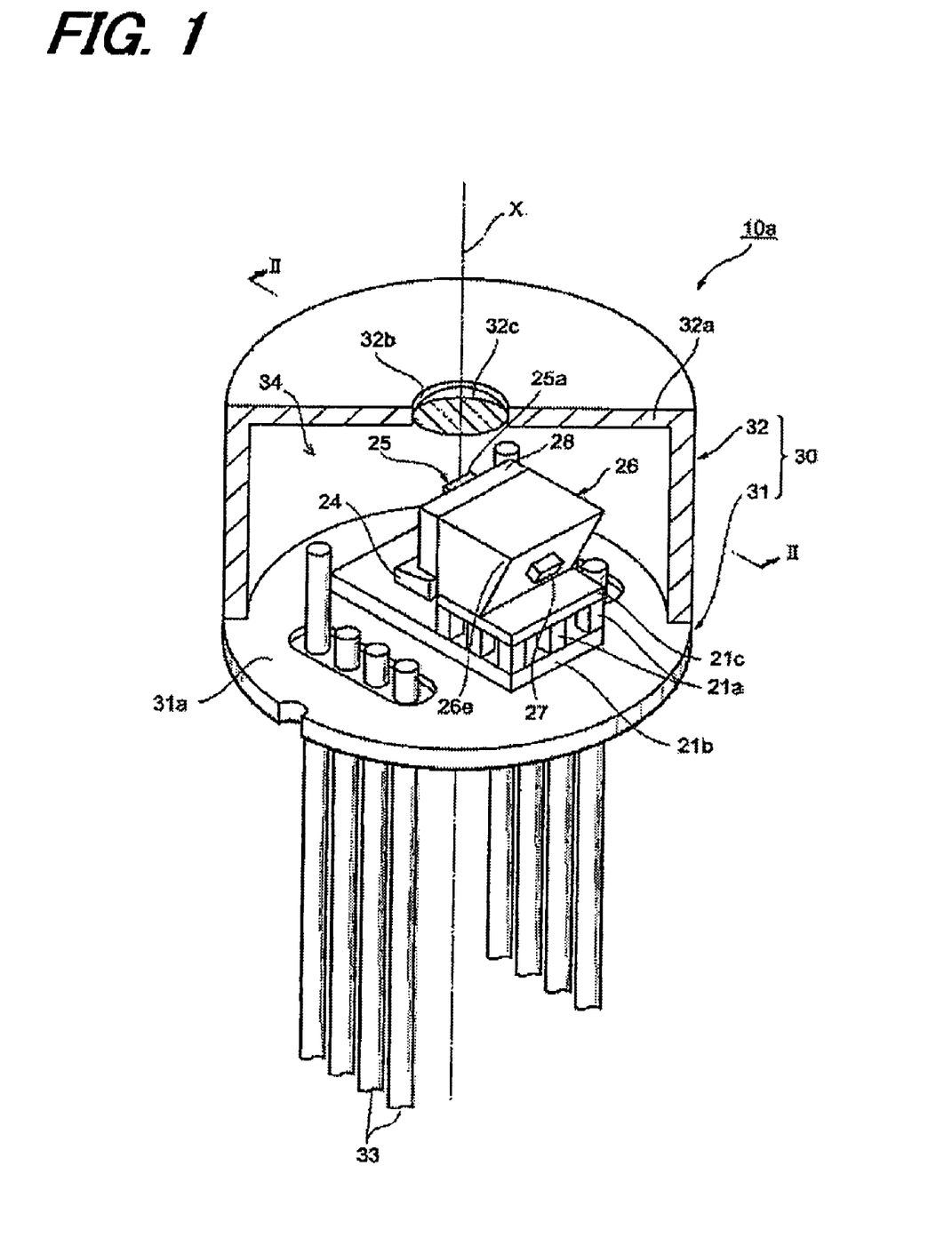
FIG. 1 is a partial broken perspective view of a light-emitting module according to a first embodiment of the invention.
Figure 2:
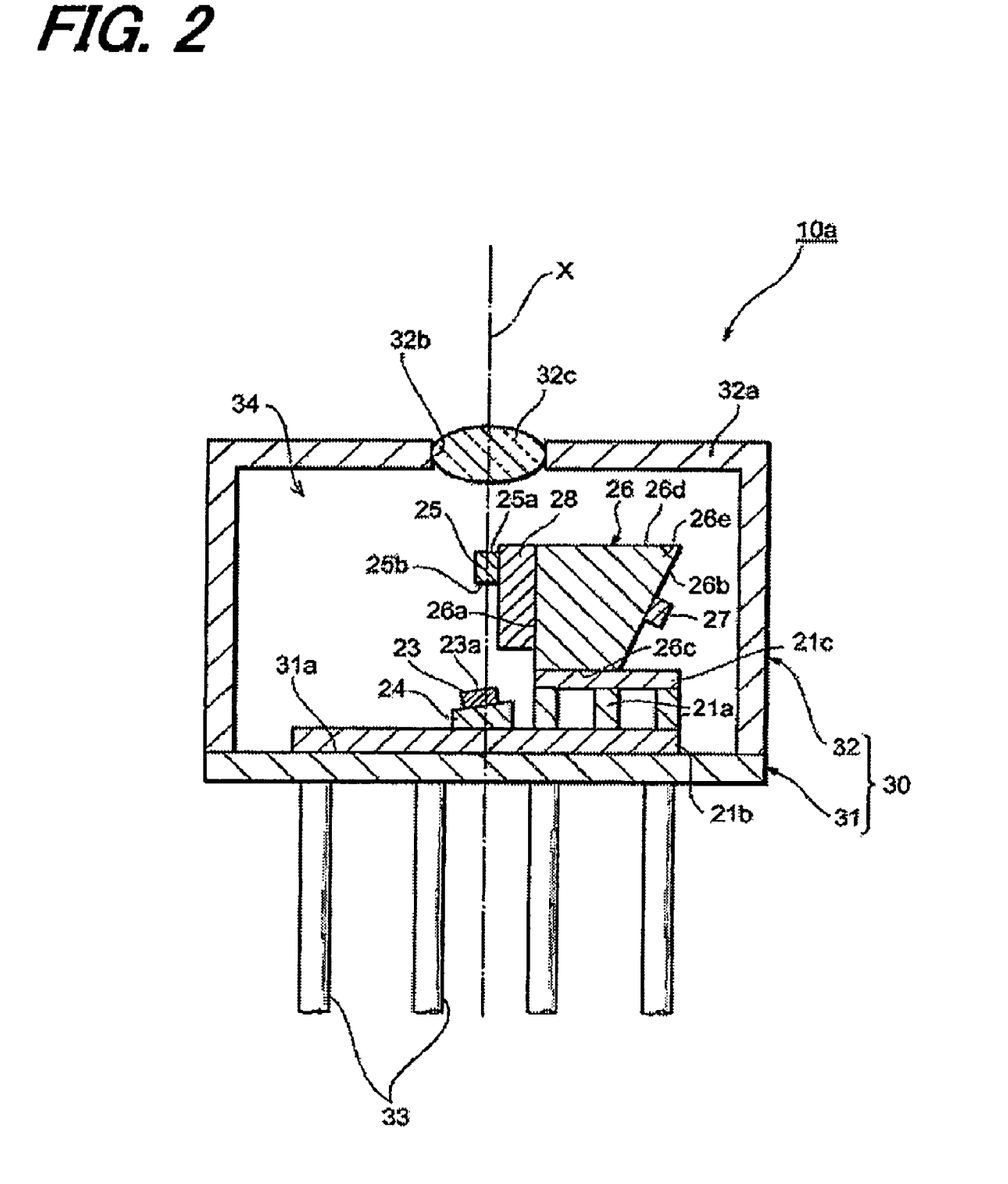
FIG. 2 is a cross-sectional view taken along the line II-II of FIG. 1.

FIG. 1 is a partial broken perspective view of a light-emitting module 10a according to a first embodiment of the invention. FIG. 2 is a cross-sectional view of the light-emitting module 10a taken along the line II-II in FIG. 1. The light-emitting module 10a is a coaxial type and includes a can package 30 housing electronic components such as a semiconductor laser diode (hereinafter referred to as an LD).

The can package 30 includes a stem 31 and a cap 32. The stem 31 is disk-shaped and a primary surface 31a of the stem 31 is orthogonal to the center axis x of the can package 30. Electronic components such as the LD are mounted on the primary surface 31a of the stem 31. A plurality of lead terminals 33 is extended from the stem 31. These lead terminals 33 pass the stem 31 in parallel to the center axis x.

The cap 32 is a cylindrical component having a ceiling 32a. A lens 32c, focusing the light from the LD, is fitted in an opening 32b provided at the ceiling 32a. The cap 32 is fixed on the primary surface 31a of the stem 31 and houses an electronic component in a space 34 which is enclosed by the cap 31 and the stem 32. To be more precise, a thermoelectric cooler 21 comprised of a plurality of thermo-electric elements 21a, a lower plate 21b and an upper plate 21c, a photodiode (hereinafter referred to as a PD) 23, a PD carrier 24, the LD 25, a base 26, a thermistor 27, and an LD carrier 28 are housed in the space 34.

As for the thermo-electric cooler 21, which is also called a Pertier device and includes the lower plate 21b, the upper plate 21c and a plurality of Peltier elements 21a (Pertier Elements) interposed between the lower plate 21b and the upper plate 21c. Both the lower plate 21b and the upper plate 21c are made of insulating material with good thermal conductivity. The lower plate 21b is fixed to the primary surface 31a of the stem 31. The upper plate 21c is fixed to the top of the thermo-electric cooler 21. The Peltier elements 21a are electrically connected in series to each other. The electrodes at both end of each Peltier element 21a are connected to two lead terminals 33 via a bonding wire. When a control current is supplied to the thermoelectric cooler 21 via the lead terminal 33, one of the upper plate 21b and the lower plate 21c serves as a heat-absorbing surface or a heat-emitting surface and the other as the other side of the heat-absorbing surface or the heat-emitting surface depending on the direction of the control current. This allows control of the temperature of a component mounted on the upper plate 21c.

The upper plate 21c mounts a base 26. The base 26 is a block having a section of a trapezoidal shape and is made of metal such as CuW or ceramics with good thermal conductivity. The base 26 has a first side 26a, a second side 26b, a bottom surface 26c and a top surface 26d. As shown in FIG. 2, the first side 26a is fixed to LD carrier 28 and the thermistor 27 is mounted on the second side 26b. The bottom surface 26c is in contact with the upper plate 21c of the thermo-electric cooler 21. While the first side 26a of the base 26 is almost perpendicular to the bottom surface 26c, the second side 26b is slanted so as to include an overhung portion 26e with respect to the bottom surface 26c. The overhung portion 26e thermally shields the thermistor 27 from the ceiling 32a of the cap 32.

The LD carrier 28 mounts the LD 25 and is made of insulating material such as ceramics. The LD 25 is fixed on the first side 26a of the base 26 via the LD carrier 28. The LD 25 is arranged on the LD carrier 28 so that its light-emitting surface 25a and the light-reflecting surface 25b will include a center axis x and will be orthogonal to the center axis x.

A bonding wire (not shown) connects the anode of the LD 25 with the wiring pattern on the LD carrier 28. The cathode electrode of the LD 25 is directly bonded to the wiring pattern on the LD carrier 28 through die mounting the LD. Further, the wiring pattern on the LD carrier 28 is connected to a corresponding lead terminal 33 via a bonding wire (not shown). When an electric current is supplied to the LD 25 via the lead terminal 33, the LD 25 outputs laser light from the light-emitting surface 25a and the light-reflecting surface 25b.

The PD 23 measures the output of the outgoing light emitted by the LD 25, in particular the light emitted from the light-reflecting surface 25b. One electrode of the anode and cathode of the PD 23 is directly connected to the wiring pattern on the PD carrier 24 and the other electrode is connected to a corresponding lead terminal 33 via the bonding wire (not shown). The PD carrier 24 is fixed on the lower plate 21b of the thermo-electric cooler 21. The wiring pattern on the PD carrier 24 is connected to one of the lead terminals 33 via a bonding wire (not shown). The PD 23 has a light-receiving surface 23a facing the light-reflecting surface 25b of the LD 25. The PD 23 receives the light output from the light-reflecting surface 25b of the LD 25 and generates a photo current corresponding to its intensity to outside the light-emitting module 10a via the lead terminal 33.

The thermistor 27 measures the ambient temperature of the LD 25. As described above, the thermistor 27 is mounted on the second side 26b of the base beneath the overhung portion 26e. The overhung portion 26e thermally shields the thermistor 27 from the ceiling 32a of the cap 32. Each of the two electrodes of the thermistor 27 is connected to the corresponding lead terminal 33 via the bonding wire (not shown). The thermistor 27 is an element that varies its electric resistivity depending on the temperature of the LD 25. The resistivity of the thermistor 27 is measured via the lead terminal 33 to detect the temperature of the upper plate 21c of the thermo-electric cooler 21, that is, the temperature of the LD 25.

Figure 3:
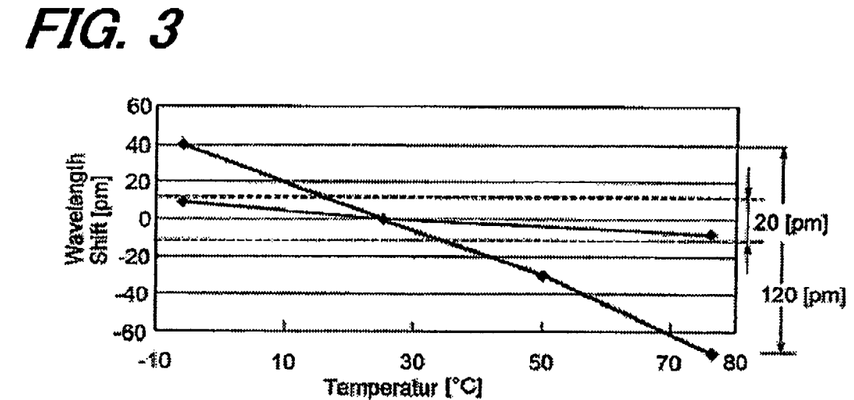
FIG. 3 shows a view that compares the variations in the emitting light wavelength of a laser diode with respect to the temperature of a package according to an light-emitting module of the invention with those according to a conventional light-emitting module.

The temperature characteristic of the light-emitting module 10a will be described as referring to FIG. 3. FIG. 3 shows variations of the emitting wavelength of the LD 25 against the temperature of the package 30 in comparison between the present module 10a and a conventional module. The conventional module has a base whose cross section is a rectangular. A side of the base where the thermistor is fixed is perpendicular to the bottom surface and top surface of the base. Thus, the thermistor is exposed to the ceiling of the cap. In an experiment of FIG. 3, the driving current of the LD is set to be 40 mA and the temperature around the LD controlled by the thermistor 27 is set to 40[° C.].

In the conventional light-emitting module, the emitting wavelength of the LD varies as much as approximately 120 pm while the case temperature varies from –10[° C.] to 80[° C.]. On the other hand, in the present light-emitting module 10a, the variation of the emitting wavelength is less or equal to 20 pm. The reduction of the radiation in the emitting wavelength is due to the following reasons: in the present light-emitting module 10a, the overhung portion 26e thermally shields the thermistor 27 from the ceiling 32a of the cap 32 so that the radiation from the ceiling 32a is shielded by the base 26, while the thermo-electric cooler 21 controls the temperature of the base 26. It is thus possible to suppress the radiation from the package 32 to the thermistor 27. The thermistor may accurately measure the ambient temperature of the LD 25.

When a metal or ceramics with a good thermal conductivity is used for the base 26 as in this embodiment, it is possible to enhance the temperature controllability of the base 26 by the thermo-electric cooler 21 thus efficiently preventing heat radiated from the ceiling 32a to the thermistor 27. Further, only by changing the shape of the base 26 from that of the conventional one, the function of this invention can be also achieved without additional components.

Figure 4:
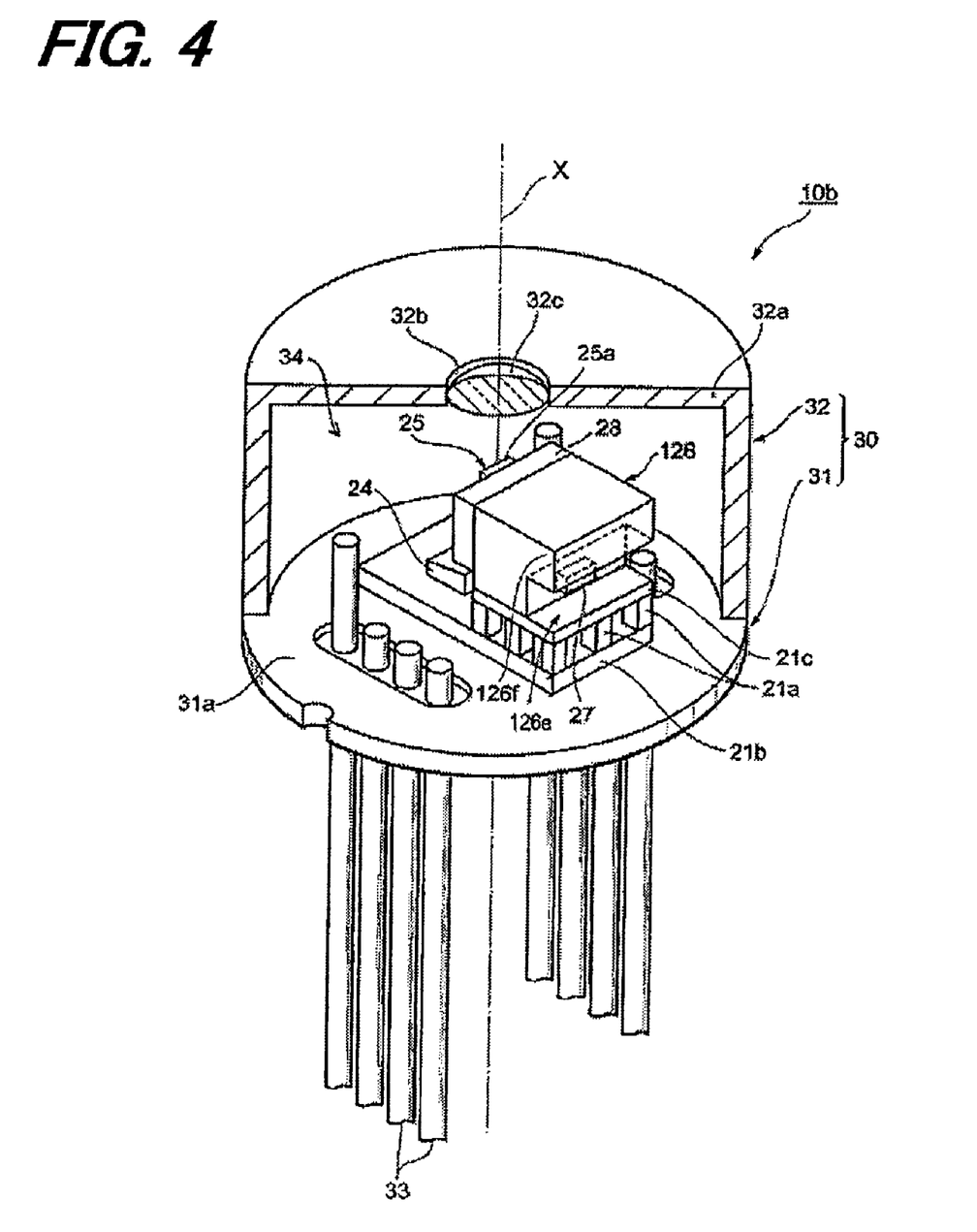
FIG. 4 is a partial broken perspective view of a variation of a light-emitting module according to the first embodiment of the invention.

FIG. 4 is a partial broken perspective view of a light-emitting module 10a according to a modification of the embodiment shown in FIG. 1. The light-emitting module 10b has a base 126 whose cross section is an L-shape instead of the base 26 with a trapezoidal cross section. The base 126 has a side that includes two surfaces and a step connecting the two surfaces instead of the second side 26b of the base 26 shown in FIG. 1. The other arrangement is the same as that of the first embodiment.

The second side of the base 126 includes two surfaces, one of which 126f protrudes farther than the other so as to form an overhung portion. The overhung portion 126f and the upper plate 21c of the thermoelectric cooler 21 form a recessed portion 126e. The thermistor 27 is mounted on the surface in the recessed portion 126e.

The overhung portion 126f thermally shields the thermistor 27 from the ceiling 32a of the cap 32. It is thus possible to suppress the heat radiated from the ceiling 32a to the thermistor 27, same as the first embodiment. The thermistor 27 is thus capable of accurately measuring the temperature of the upper plate 21c of the thermo-electric cooler 21 thus reducing the variation in the emitting wavelength of the LD 25.

Second Embodiment

Figure 5:
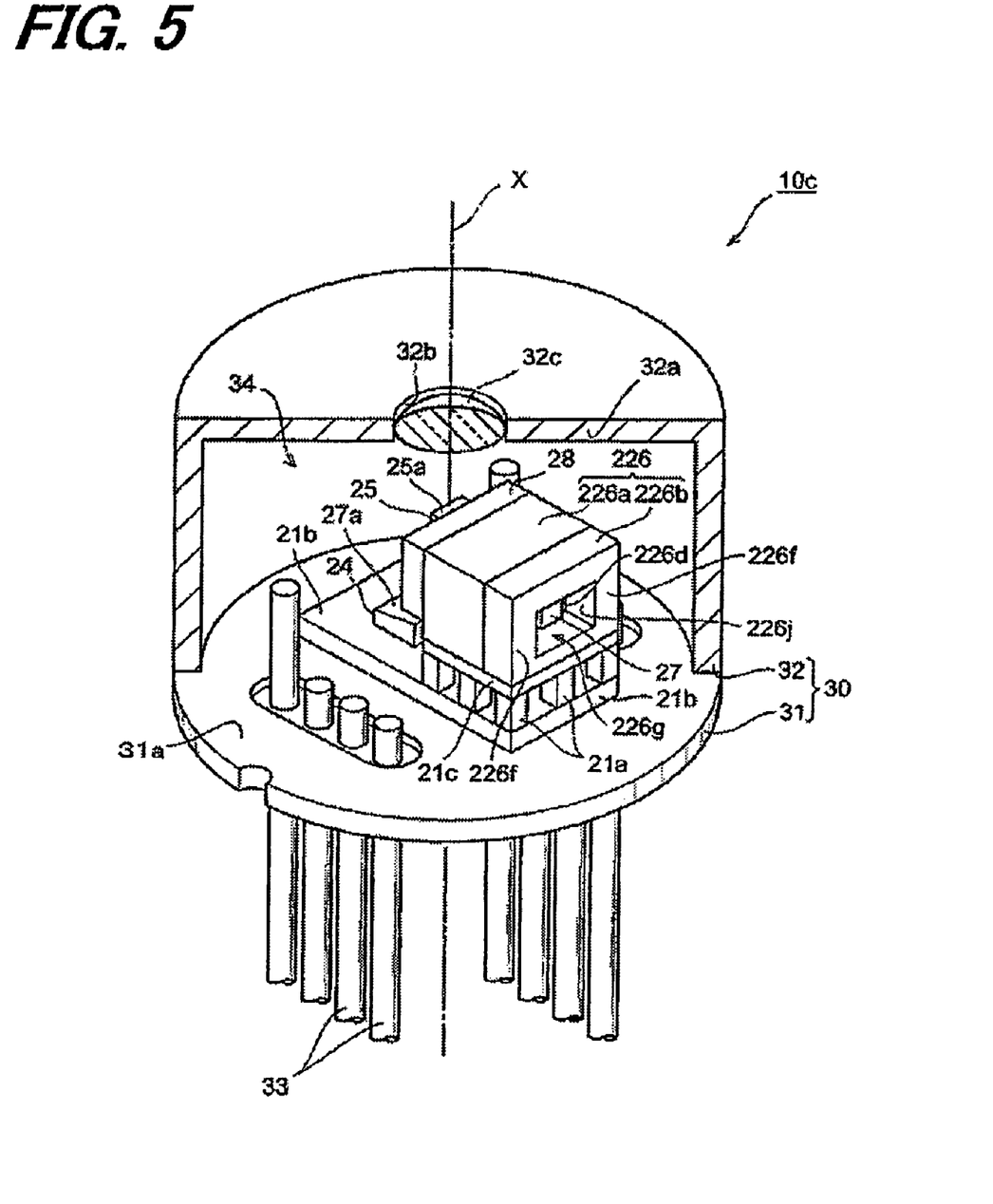
FIG. 5 is a partial broken perspective view of a light-emitting module according to a second embodiment of the invention.
Figure 6:
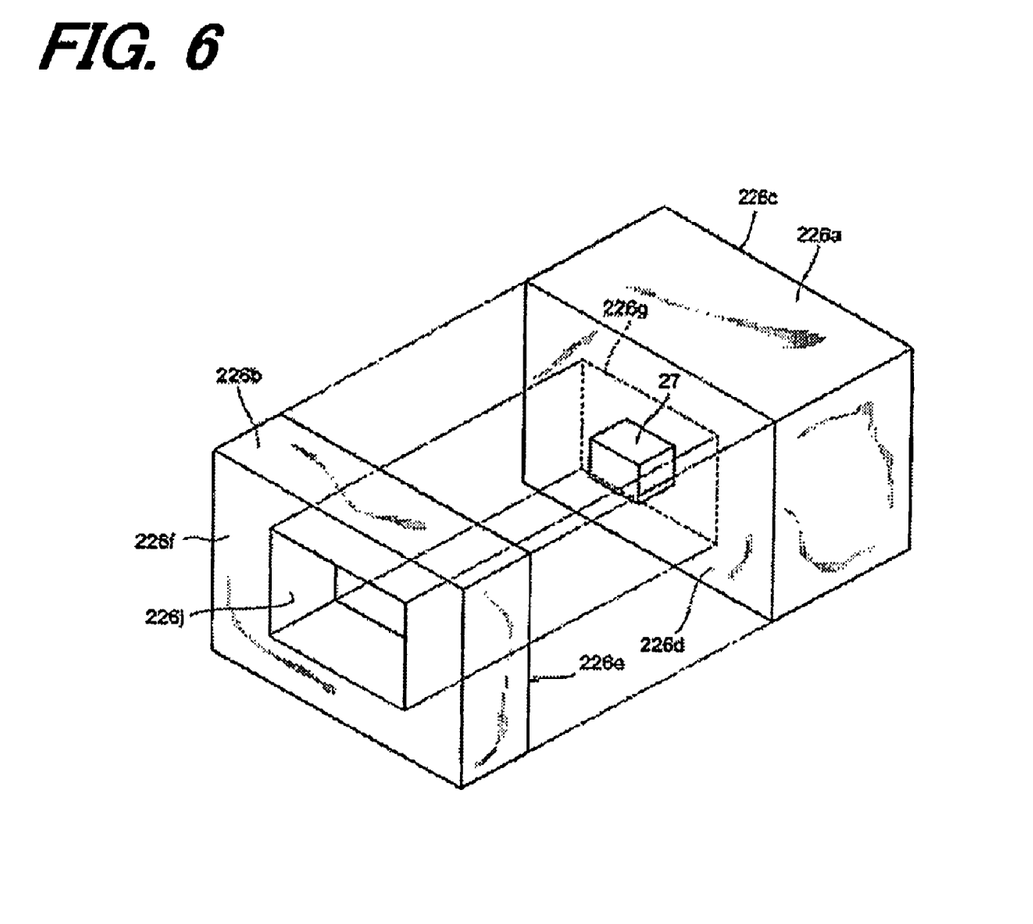
FIG. 6 is an exploded view of a base mounted on the light-emitting module according to the second embodiment.
Figure 7:
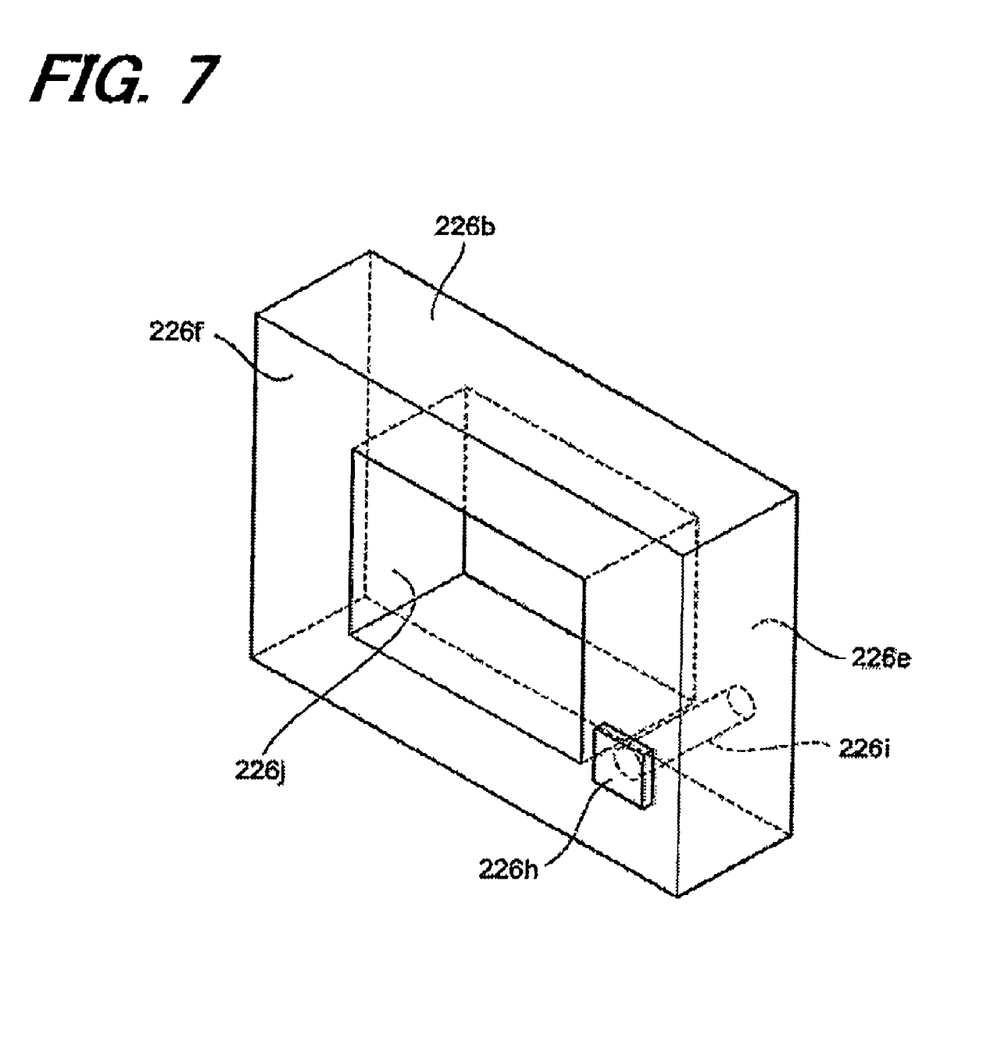
FIG. 7 is a perspective view of a variation of the base shown in FIG. 6.

FIG. 5 is a partial broken view of a light-emitting module 10c according to the second embodiment. FIG. 6 is an exploded view of the base 116 mounted on the light-emitting module 10c. The base 226 according to present embodiment includes a first portion 226a and a second portion 226b. The first portion 226a has a surface 226c that mounts an LD carrier 28 and its opposite surface 226d. The second portion 226b has a surface 226e facing the surface 226d of the first portion 226a and its opposite surface 226f. The surface 226d of the first portion 226a is attached to the surface 226e of the second portion 226d.

Near the center of the surface 226f of the second portion 226b, an opening 226g is formed such as to pass the second portion 226b. The surface 226d of the first portion 226a is exposed in the opening 226g. The thermistor 27 is mounted approximately at the center of the interior of the opening 226g. The inner wall 226j of the opening 226g thermally shields the thermistor 27 from the ceiling 32a of the cap 32. The surface 226d of the first portion 226a may form a wiring patterns electrically connected to the thermistor 27.

The base 226 including the opening 226g may be formed by individually forming the first portion 226a and the second portion 226b where the opening 226g is formed and then attaching both to each other, or may be formed through etching or grinding the side 226b of the integral base 226.

Figure 8:
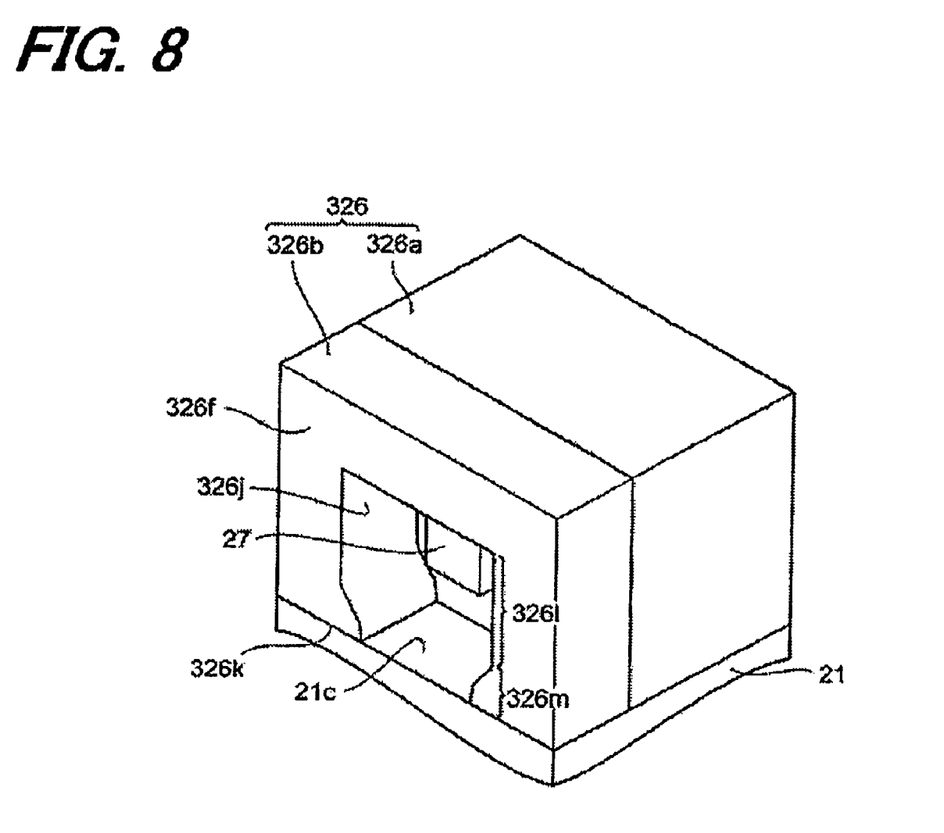
FIG. 8 is another perspective view of a variation of the base shown in FIG. 6.

In case the first and second portions 226a, 226b are individually formed and the second portion 226b is made of AlN, a pad 226h and a via 226i may be formed in the second portion 226b as shown in FIG. 8. The pad 226h is formed on the surface 226f to cover the via 226i.

One end of the via 226i is exposed on the surface 226e and is electrically connected to the wiring pattern provided on the surface 226d of the first portion 226a. In this case, the pad 226h is electrically connected to the terminal of the thermistor 27 through the via 226i and the wiring pattern on the surface 226d. In a case where the thermistor 27 is a die thermistor whose electrodes are formed on the front surface and rear surface thereof and the base 226 is made of a metal, the electrode on the rear surface is in direct contact with the surface 226d and the second portion 226b is in contact with the surface 226d. It is thus possible to secure electrical conduct with the electrode on the rear surface of the thermistor 27 by directly bonding a wire to the second portion 226b without using the pad 226h or the via 226i.

FIG. 8 shows a modified base 326. The base 326 has a first portion 326a and a deformed second portion 326b. The surface 326f of the second portion 326b includes a cutting 326m extending from its edge or bottom surface 326k shown in FIG.

8 to the center of the surface 326f and an opening 326g connecting to the cutting 326m and formed almost at the center of the surface 326f.

The opening 326g corresponds to the opening 226g shown in FIG. 5. The inner wall 326j of the opening 326g and the cutting 326m thermally shields the thermistor 27 from the ceiling 32a of the cap 32. The cutting 326m may extend from the center of the surface 326f to the bottom surface 326k, that is, the upper plate 21c of the thermo-electric cooler 21 or from the center of the surface 326 toward the side, as long as the inner wall 326j of the opening 326g and the cutting 326m thermally shields the thermistor 27 from the ceiling 32a of the cap 32. While the width of the cutting 326m shown in FIG. 8 is smaller than the width of the opening 326g, the cutting 326m may have the same width or larger width.

Third Embodiment

Figure 9:
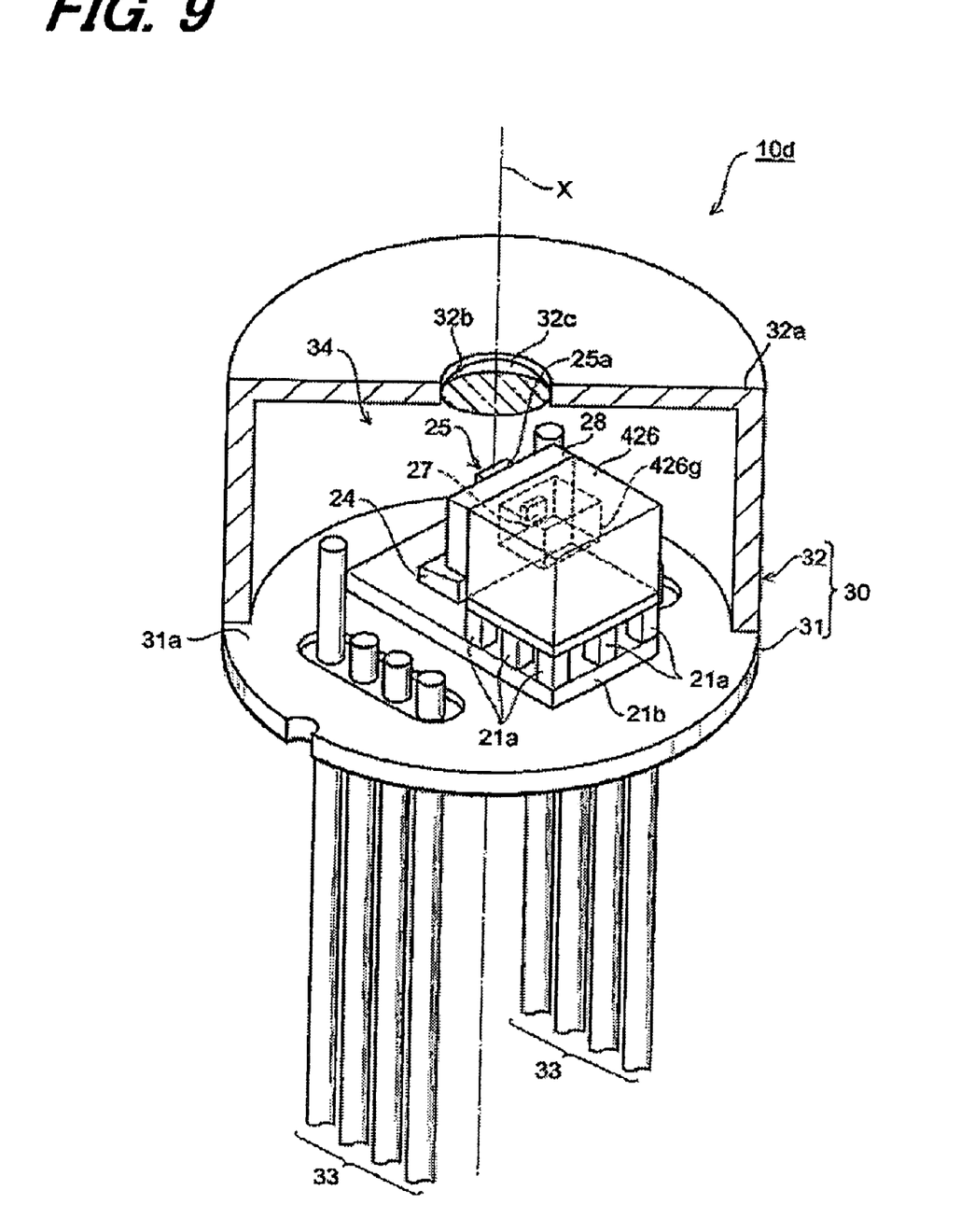
FIG. 9 is a partial broken perspective view of a light-emitting module according to a third embodiment of the invention.
Figure 10:
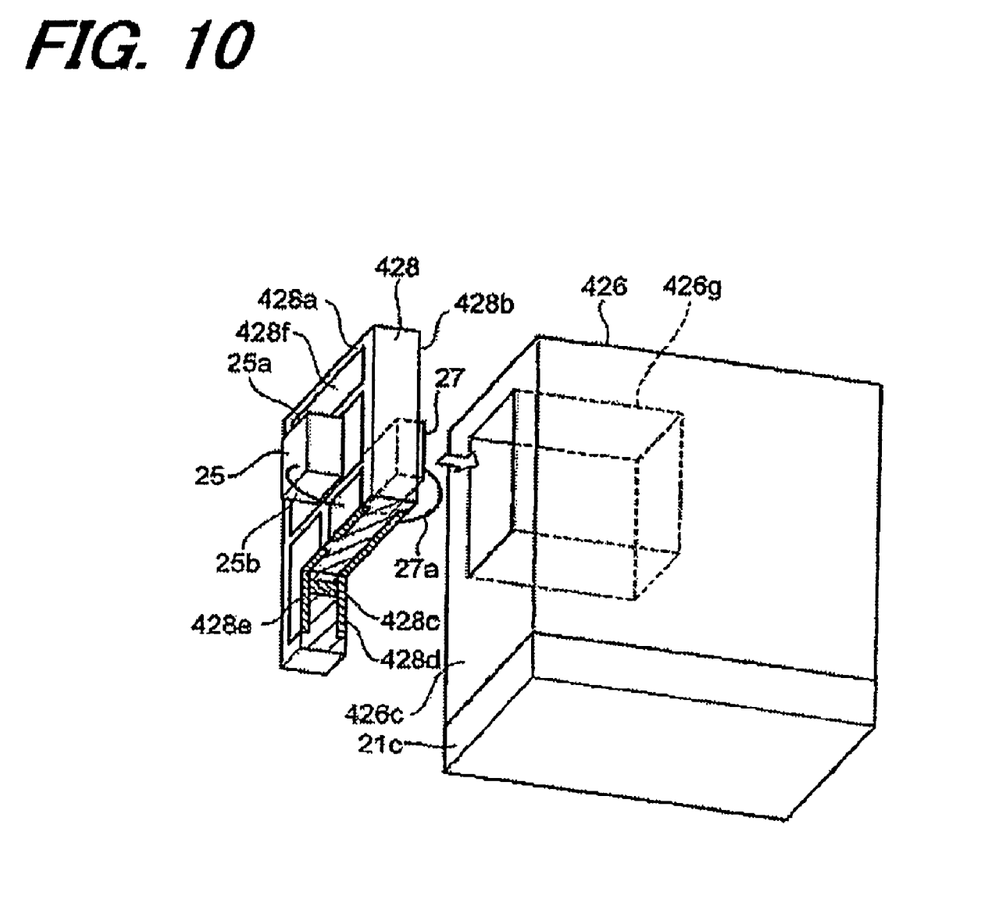
FIG. 10 is an exploded view of a base and an LD carrier mounted on the light-emitting module according to the third embodiment of the invention.

FIG. 9 is a partial broken view of a light-emitting module 10d according to the third embodiment. A light-emitting module 10d according to this embodiment has a base 426 and an LD carrier 428. FIG. 16 is an enlarged view of the base 426 and the LD carrier 428. The base 426 is made of metal such as CuW and has a rectangular shape. The surface 426a of the base 426 mounts an LD carrier 428 and an LD 25 is mounted on the LD carrier 428. The surface 426a includes a hollow 426g with a rectangular shape. As shown in FIG. 10, the LD carrier 428 mounts the thermistor 27 on a second surface 428b opposite to the first surface 428a of the LD carrier 428 that mounts the LD 25. The carrier 428 may be made of an insulating material with good thermal conductivity. For example, aluminum nitride (AlN) is an appropriate material. The thickness of the carrier 428 is about 0.2 mm.

The LD 25 is mounted on the first surface 428a of the LD carrier 428 so that the light-emitting surface 25a and the light-reflecting surface 25b thereof will include a predetermined axis x and will be orthogonal to the axis x. One electrode (top electrode) of the LD 25 is electrically connected to a wiring provided on the carrier 428 with a bonding wire. The other electrode (bottom electrode) is connected to another wiring pattern formed on the LD carrier 428 by the die bonding of the LD 25. The wiring patterns on the LD carrier 428 are respectively connected to a lead terminal 33 via a bonding wire.

The thermistor 27 is mounted on the second surface 428b opposite to the first surface 428a. One electrode of the thermistor 27 is connected to the wiring pattern 428d on the second surface 428b with a bonding wire pattern 27a. The wiring pattern 428d is connected to the wiring pattern 428e on the first surface 428a with a via 428c that penetrates the carrier 428. The wiring pattern 428e is connected to a corresponding lead terminal 33 with a bonding wire (not shown). The other electrode of the thermistor 27 is directly bonded to another wiring pattern on the second surface 428b and is connected to the wiring pattern 428f on the first surface 428a with another via. The wiring pattern 428f is connected to a corresponding lead terminal 33.

The thermistor 27 detects the temperature of the LD 25 via the carrier 428 and changes its electric resistivity. An external controller (not shown) controls an electric current supplied to the thermo-electric cooler 21 based on the variation of the resistivity of the thermistor 27 in order to keep the temperature of the LD 25 constant.

In the above arrangement, the thermistor 27 and the bonding wire 27a are enclosed within the hollow 426g formed on the surface 426a of the base 426. That is, the thermistor 27 is enclosed in a space surrounded by the base 426 and the carrier 428. The base 426 efficiently shields the heat radiated from the ceiling 32a of the cap 32.

Fourth Embodiment

Figure 11:
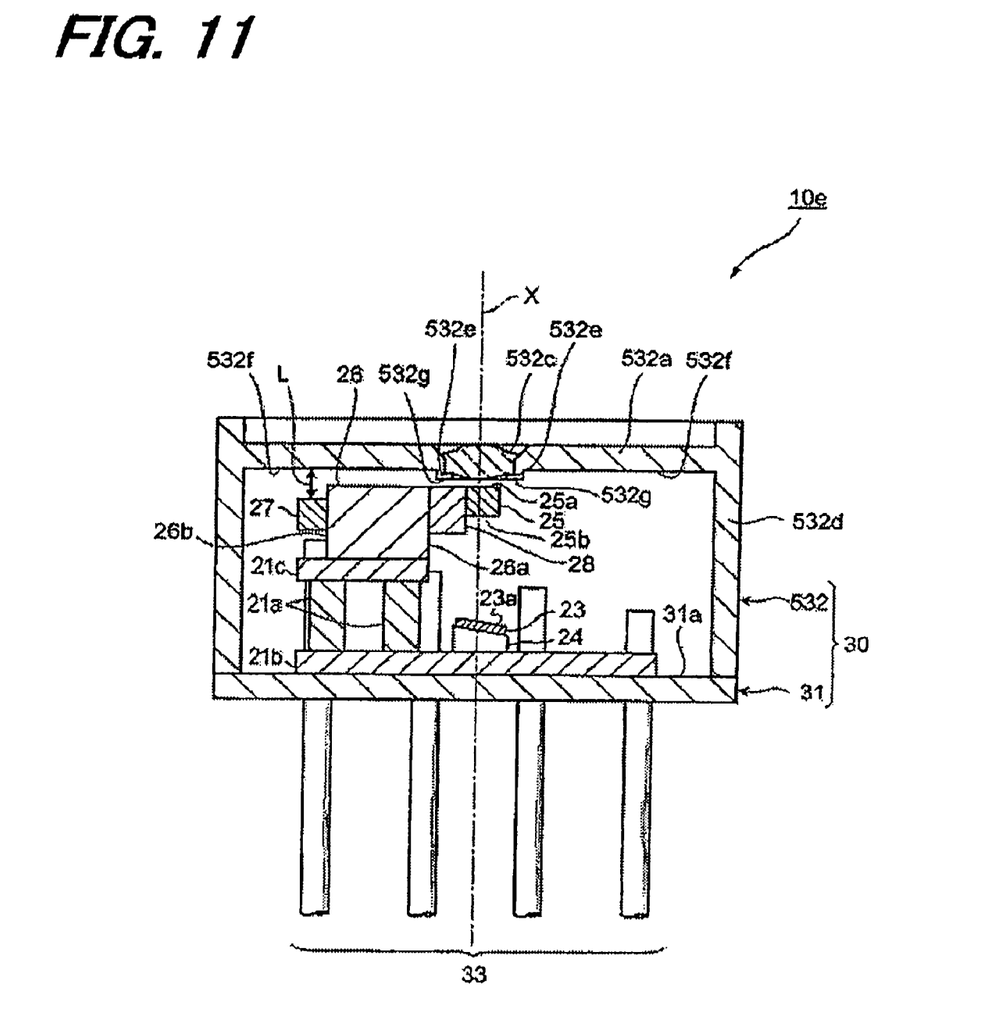
FIG. 11 is a cross-sectional view of a light-emitting module according to a fourth embodiment of the invention.

FIG. 11 is a cross-sectional view of a light-emitting module be according to the fourth embodiment of the invention. The cap 532 of the light-emitting module 10e includes a side wall 532d and a ceiling 532a. The ceiling 532a includes a supporting portion 532e for fixing a lens 532c. The lens 532c of this embodiment is an aspherical lens.

The ceiling 532a includes a depressed portion 532f recessed outside from the supporting portion 532e. The depressed portion 532f has a doughnut shape surrounding the supporting portion 532e and extends from the supporting portion 532e to the side wall 32d. The thermistor 27 faces the depressed portion 532f. In the fourth embodiment, the spacing L between the top surface of the thermistor 27 and the inner surface of the depressed portion 532f is constant.

As described above, in the light-emitting module 10e according to the fourth embodiment, the ceiling 532a of the cap 532 includes the depressed portion 532f recessed toward the outside of the lens supporting portion. The thermistor 27 is arranged to face the recessed portion 532f. In this embodiment, it is possible to keep the thermistor 27 apart from the ceiling 532a even when the lens 532c is positioned closer to the LD 25. The thermistor 27 is hardly affected by the heat radiated from the cap 532 (periphery of the light-emitting module 10e) than a conventional module. This suppresses the temperature variation of the light-emitting wavelength of the LD 25.

Figure 12:
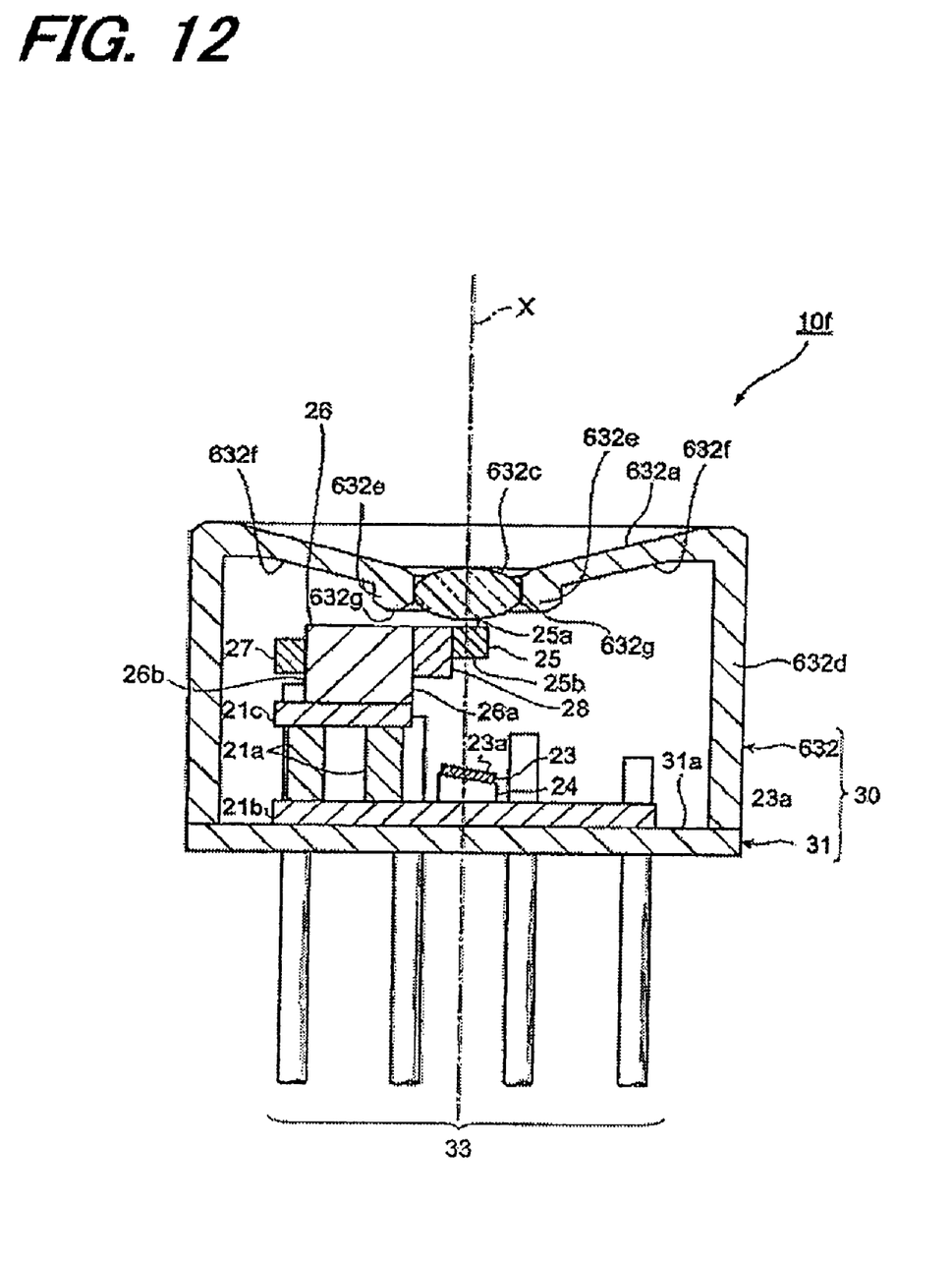
FIG. 12 is a cross-sectional view of a variation of the light-emitting module according to the fourth embodiment of the invention.

FIG. 12 is a cross-sectional view of a modification of the light-emitting module 10e according to the fourth embodiment of the invention. The ceiling 632a of the module 10f according to this modification includes the supporting portion 632e that supports the lens 632c and protrudes toward the stem 32 and a depressed portion 632f that is recessed toward the outside of the cap 632 more than the supporting portion 632e. As shown in FIG. 12, the depth of the depressed portion 632f increases from the supporting portion 632e toward the side wall 632d of the cap 632. The depressed portion 632f has a doughnut shape surrounding the supporting portion 632e. The thermistor 27 is mounted on a side 26b of the base 26, which is projected on the periphery of the stem. Thus, the spacing between the top surface of the thermistor 27 and the ceiling 632a of the cap 632 increases so that the thermistor 27 is less affected by the heat radiated from the ceiling 632a.

Figure 13:
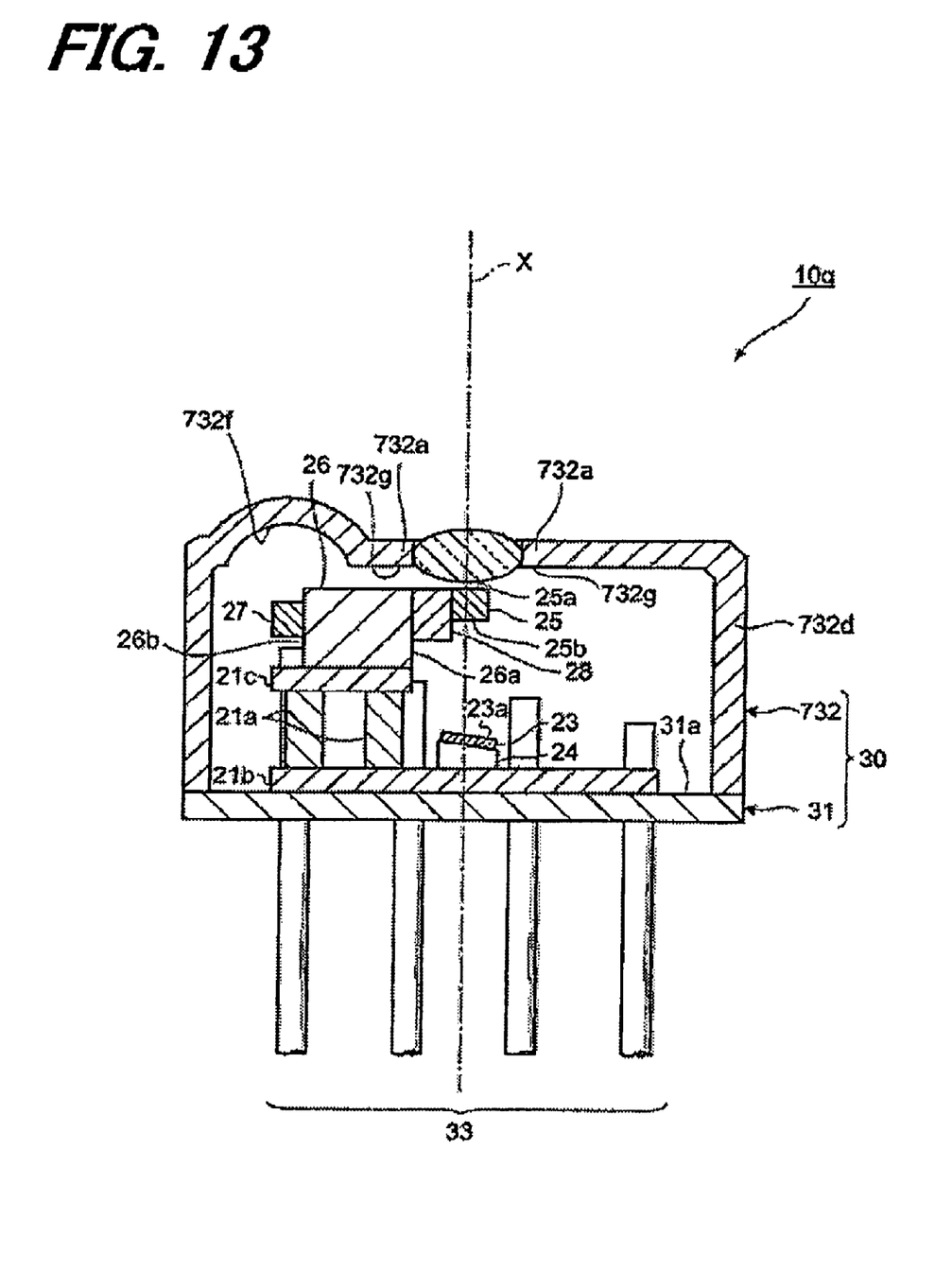
FIG. 13 is a cross-sectional view of another variation of the light-emitting module according to the fourth embodiment of the invention.

FIG. 13 is a cross-sectional view of a modification of the light-emitting module 10g according to the fourth embodiment. The ceiling 732a of the light-emitting module 10g of the present modification includes the ceiling 732e with a partially protruding portion 732e protruding outside. The depressed portion 732f is positioned above the thermistor 27. The cap 732 of this shape can be manufactured as low cost through the pressing thus reducing the manufacturing cost. The spacing between the thermistor 27 and the ceiling 732a shown in FIG. 13 can be extended compared with the spacing in a conventional module. This efficiently suppresses the heat radiated from the ceiling 732a to the thermistor 27.

While the invention has been described in connection with the exemplary embodiments, it will be obvious to those skilled in the art that various changes and modification may be made therein without departing from the present invention, and it is aimed, therefore, to cover in the appended claims all such changes and modifications as fall within the spirit and scope of the present invention.

What is claimed is:

1. A light-emitting module comprising:

a Laser diode;

a thermistor that monitors a temperature of the laser diode;

a base on which the laser diode and the thermistor are mounted, the base including a first side for mounting the laser diode and a second side for mounting the thermistor;

a thermo-electric cooler for controlling the temperature of the laser diode, the thermo-electric cooler including a top plate, a bottom plate and a plurality of Peltier elements put between the top plate and bottom plate, wherein the base is mounted on the top plate; and a CAN package including a cap and a stem that mounts the thermo-electric cooler thereon, the CAN package housing the laser diode, the base, the thermistor and the thermo-electric cooler in a cavity formed by the cap and the stem, wherein the base provides a structure to shield the heat radiated from the cap toward the thermistor, wherein the second side is provided with an overhung portion as the structure to shield the heat, and wherein the second side includes third and fourth sides each extending substantially in perpendicular direction with respect to a bottom of the base which face and comes in contact with the top plate of the thermo-electric cooler, the fourth side protruding further than the third side so as to form the overhung portion, the thermistor being mounted on the third side and fully covered by the fourth side with respect to the ceiling of the cap.

* * * * *